(12) United States Patent
Ho et al.

(10) Patent No.: US 8,179,295 B2
(45) Date of Patent: May 15, 2012

(54) SELF-CALIBRATED CURRENT SOURCE AND DAC USING THE SAME AND OPERATION METHOD THEREOF

(75) Inventors: Chun-Ta Ho, Kaohsiung (TW); Chuan-Ping Tu, Hsinchu County (TW)

(73) Assignee: Realtek Semiconductor Corp., Hsinchu (TW)

( * ) Notice: Subject to any disclaimer, the term of this patent is extended or adjusted under 35 U.S.C. 154(b) by 146 days.

(21) Appl. No.: 12/779,619

(22) Filed: May 13, 2010

(65) Prior Publication Data

US 2010/0289680 A1 Nov. 18, 2010

(30) Foreign Application Priority Data

May 15, 2009 (TW) ................................ 98116109 A

(51) Int. Cl.
*H03M 1/66* (2006.01)
(52) U.S. Cl. ..................... 341/145; 341/144; 341/136
(58) Field of Classification Search .................. 341/145, 341/144, 136
See application file for complete search history.

(56) References Cited

U.S. PATENT DOCUMENTS

| | | | | |
|---|---|---|---|---|
| 5,446,455 | A * | 8/1995 | Brooks | 341/145 |
| 5,666,118 | A | 9/1997 | Gersbach | |
| 6,166,670 | A * | 12/2000 | O'Shaughnessy | 341/136 |
| 6,664,499 | B1 | 12/2003 | Brink et al. | |
| 7,158,431 | B2 * | 1/2007 | Tran | 365/207 |
| 7,342,840 | B2 * | 3/2008 | Tran | 365/207 |
| 2006/0215471 | A1 * | 9/2006 | Tran | 365/205 |
| 2007/0002174 | A1 * | 1/2007 | Wei et al. | 348/525 |

* cited by examiner

*Primary Examiner* — Jean B Jeanglaude
(74) *Attorney, Agent, or Firm* — Morris Manning & Martin LLP; Tim Tingkang Xia, Esq.

(57) ABSTRACT

A background self-calibrated DAC is presented. A virtual-short theory, applicable to input/output terminals of an operational amplifier, is periodically employed so as to self-calibrate a current source serially connected with an equivalent resistor, and the DAC using the same. The DAC does not require an additional self-calibration period, and digital-to-analog conversion thereof can be realized in merely a small amount of die area. Correspondingly, a compact and high-speed current steering DAC can be realized.

26 Claims, 7 Drawing Sheets

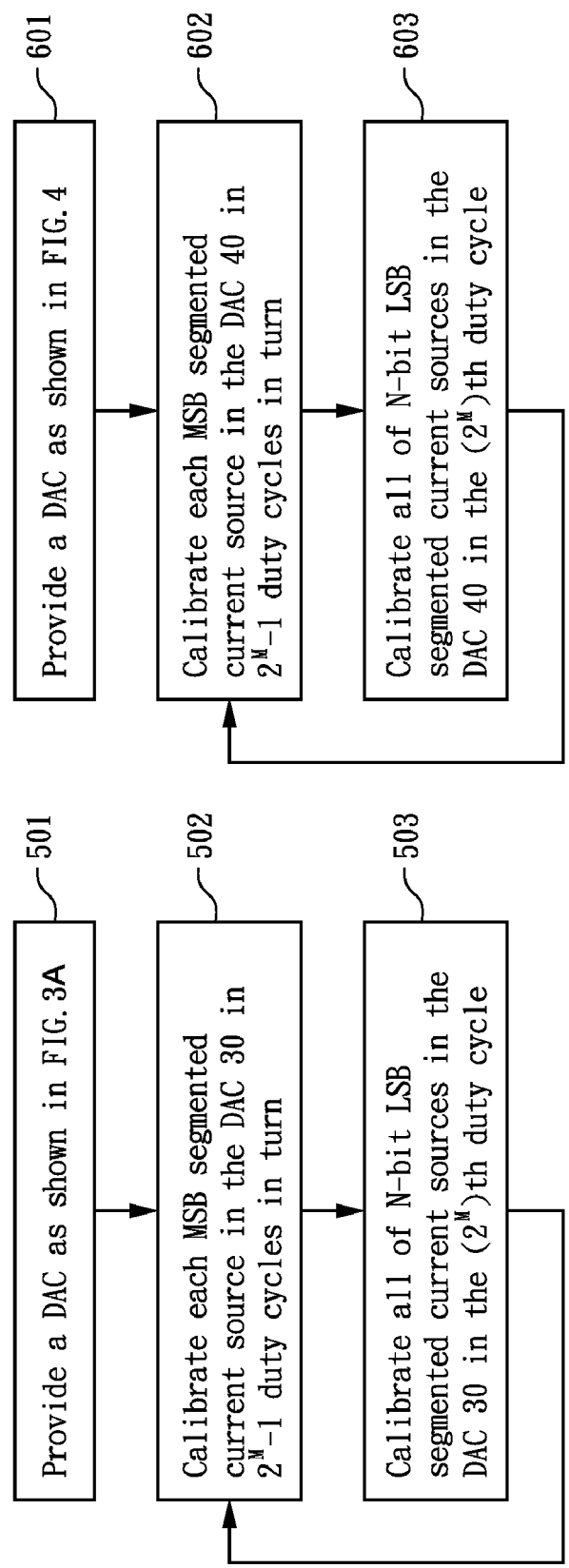

SELF-CALIBRATED CURRENT SOURCE AND DAC USING THE SAME AND OPERATION METHOD THEREOF

CROSS-REFERENCE TO RELATED APPLICATIONS

This non-provisional application claims priority under 35 U.S.C. §119(a) on Patent Application No(s). 098116109 filed in Taiwan, R.O.C. on May 15, 2009, the entire contents of which are hereby incorporated by reference.

FIELD OF THE INVENTION

The present invention generally relates to a self-calibrated device and an operation method thereof and, more particularly, to a self-calibrated current source and a segmented current steering digital-to-analog converter (DAC) using the current source and an operation method thereof.

BACKGROUND OF THE INVENTION

The self-calibration technology has been widely used in DAC. Generally, the self-calibration technology can be categorized into background calibration and foreground calibration. Background calibration means that the DAC stays at normal operations when an error is synchronously calibrated, while foreground calibration means that an error is calibrated before the DAC operates.

There are many reports disclosing methods for improving the linearity of a DAC, for example, U.S. Pat. No. 5,666,118 and U.S. Pat. No. 6,664,909. However, there are some problems in the aforesaid references that have to be overcome. U.S. Pat. No. 5,666,118 uses digital mechanism to trim the error for a DAC and stores the error of each cell of the DAC in the memory. However, the digital mechanism may be too complicated and consume a larger area and more power. U.S. Pat. No. 6,664,909 is an example utilizing the floating-gate synapse transistor to trim the current sources. The usage for the synapse transistor is inevitable for the DAC.

Accordingly, the present invention provides a self-calibrated device and an operation method thereof. More particularly, the present invention provides an analog self-calibrated method and device, capable of overcoming the problems such as large calibration circuit area, high power consumption or high manufacturing cost.

SUMMARY OF THE INVENTION

It is one object of the present invention to provide an analog self-calibrated current source and a segmented current steering digital-to-analog converter (DAC) using the current source and an operation method thereof. In the present invention, the areas and power consumption for the self-calibrated current source and the DAC are reduced with improved linearity. Moreover, the DAC operation and its calibration are carried out simultaneously.

In order to achieve the foregoing object, the present invention provides a self-calibrated current source, comprising at least: a reference current source transistor having a source coupled to a terminal of a first resistor, the source being a calibration reference; a first transistor having a source coupled to a terminal of a second resistor by way of a first switch; a second transistor having a source coupled to a terminal of a third resistor by way of a second switch; and a differential amplifier having an output terminal coupled to a gate of the second transistor by way of a third switch and having a negative input terminal coupled to a terminal of the third resistor and a positive input terminal coupled to the terminal of the first resistor; wherein a gate of the first transistor is coupled to a reference voltage, the first switch is coupled to a reference voltage, the first switch is controlled by a first clock, the second/third switch is controlled by a reverse clock of the first clock, and the first transistor and the second transistor have drains coupled to each other and sources coupled to each other.

In order to achieve the foregoing object, the present invention further provides a self-calibrated current source, comprising at least: a reference resistor having a terminal coupled to a constant current source to provide a calibration reference voltage; a first transistor having a source coupled to a terminal of a plurality of first resistors by way of a first switch; a second transistor having a source coupled to a terminal of a second resistor by way of a second switch; and a differential amplifier having an output terminal coupled to a gate of the second transistor by way of a third switch and having a negative input terminal coupled to a terminal of the second resistor and a positive input terminal receiving the calibration reference voltage; wherein a gate of the first transistor is coupled to a reference voltage, the first switch is controlled by a first clock, the second/third switch is controlled by a reverse clock of the first clock, and the first transistor and the second transistor have drains coupled to each other and sources coupled to each other as the output for the self-calibrated current source.

In order to achieve the foregoing object, the present invention further provides a segmented current steering DAC, comprising: an M-bit MSB segmented current source capable of generating an output current at an output terminal of the DAC according to a thermometer-coded input signal; an N-bit LSB segmented current source capable of generating an output current at the output terminal of the DAC according to a binary-coded input signal; a reference current source transistor having a source coupled to a terminal of a first resistor, the source being a calibration reference; a first transistor used as part of the M-bit MSB segmented current source and the N-bit LSB segmented current source, the first transistor having a source coupled to a terminal of a second resistor by way of a first switch; a second transistor used as part of the M-bit MSB segmented current source and the N-bit LSB segmented current source, the second transistor having a source coupled to a terminal of a third resistor by way of a second switch; and a differential amplifier having an output terminal coupled to a gate of the second transistor by way of a third switch and having a negative input terminal coupled to a terminal of the third resistor in turn and a positive input terminal coupled to the terminal of the first resistor so that the positive and the negative input terminals are virtually short-circuited; wherein a gate of the first transistor and a gate of the reference current source transistor are coupled to a first reference voltage, the first switch is controlled by a first clock, and the first transistor and the second transistor have drains coupled to each other and sources coupled to each other.

In order to achieve the foregoing object, the present invention further provides a segmented current steering DAC, comprising: at least an M-bit MSB segmented current source capable of generating an output current at an output terminal of the DAC according to a thermometer-coded input signal; at least an N-bit LSB segmented current source capable of generating an output current at the output terminal of the DAC according to a binary-coded input signal; a reference resistor having a terminal coupled to a constant current source to provide a calibration reference voltage; a first transistor used as part of the M-bit MSB segmented current source and the N-bit LSB segmented current source, the first transistor having a source coupled to a terminal of a second resistor by way of a first switch; a second transistor used as part of the M-bit MSB segmented current source and the N-bit LSB segmented current source, the second transistor having a source coupled to a terminal of a third resistor by way of a second switch; and a differential amplifier having an output terminal coupled to a gate of the second transistor by way of a third switch and having a negative input terminal coupled to a terminal of the third resistor and a positive input terminal receiving the calibration reference voltage so that the positive and the negative input terminals are virtually short-circuited; wherein a gate of the first transistor and a gate of the reference current source transistor are coupled to a first reference voltage.

In order to achieve the foregoing object, the present invention further provides a digital-to-analog conversion device with self-calibration, comprising:

a plurality of digital-to-analog conversion current units, comprising:

a first current unit capable of operating in one of a normal mode and a calibration according to a control signal; and a second current unit capable of operating in one of the normal mode and the calibration according to the control signal;

a calibration circuit capable of calibrating a current generated by the first current unit when the first current unit operates in the calibration mode and the second current unit operates in the normal mode according to the control signal, and calibrating a current generated by the second current unit when the second current unit operates in the calibration mode and the first current unit operates in the normal mode according to the control signal; and a control signal generation circuit coupled to the first current unit, the second current unit and the calibration circuit to generate the control signal.

In order to achieve the foregoing object, the present invention further provides a method of calibrating a segmented current steering DAC, comprising steps of:

(a) providing a DAC as previously described;

(b) calibrating each MSB segmented current source in the DAC in ($2^M$−1) duty cycles in turn;

(c) calibrating the sum of all of N-bit LSB segmented current sources in the DAC in the ($2^M$)th duty cycle; and (d) returning to step (b).

BRIEF DESCRIPTION OF THE DRAWINGS

The objects and spirits of the embodiments of the present invention will be readily understood by the accompanying drawings and detailed descriptions, wherein:

FIG. 5 is a flowchart of a method for operating a segmented current steering DAC in FIG. 3A according to a preferred embodiment of the present invention; and FIG. 6 is a flowchart of a method for operating a segmented current steering DAC in FIG. 4 according to another preferred embodiment of the present invention.

DETAILED DESCRIPTION OF THE PREFERRED EMBODIMENT

The present invention can be exemplified but not limited by various embodiments as described hereinafter.

Figure 1A:
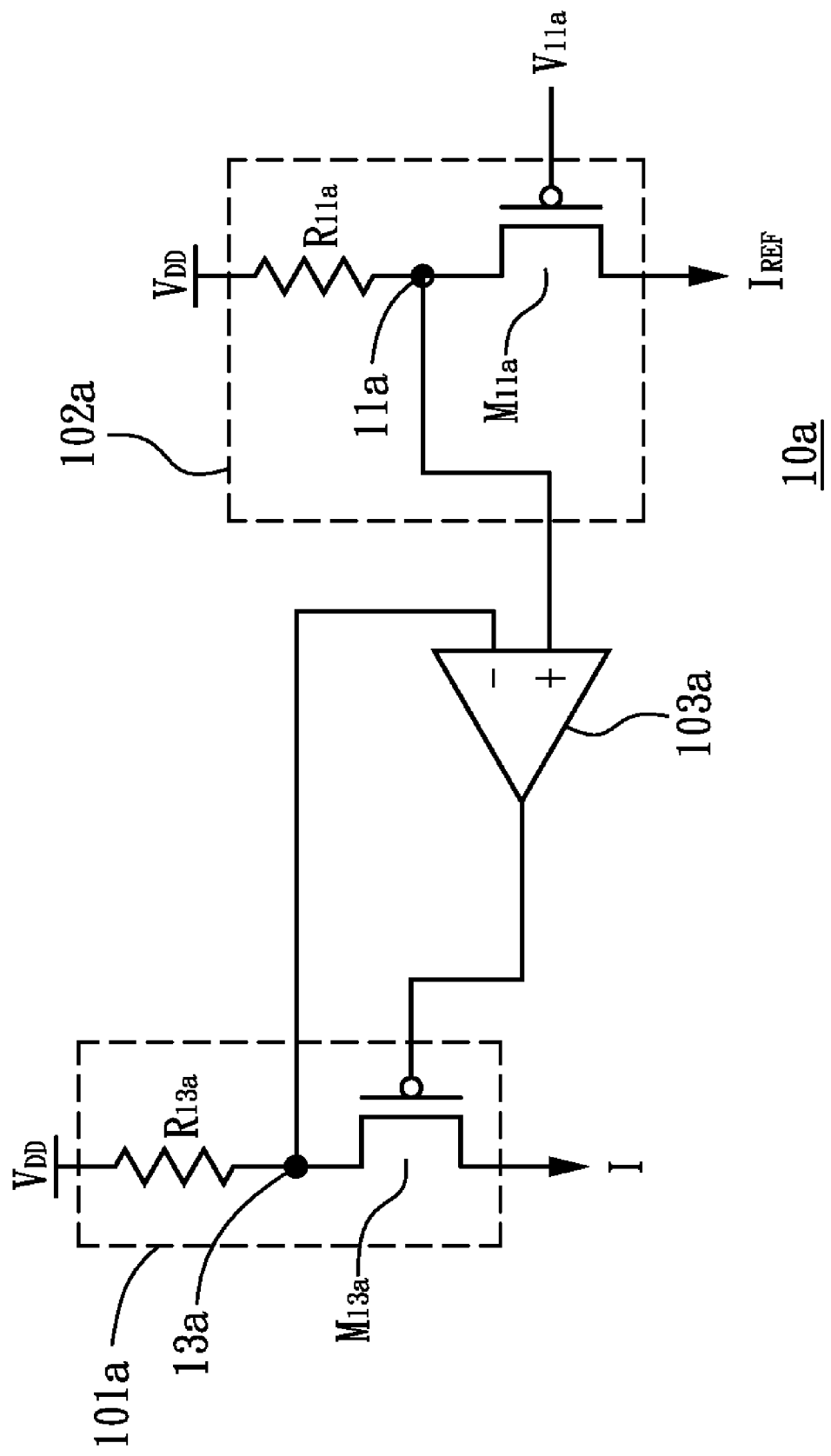
FIG. 1A is a schematic diagram of a self-calibrated current source according to a preferred embodiment of the present invention.

FIG. 1A is a schematic diagram of a self-calibrated current source $10a$ according to a preferred embodiment of the present invention. The current source $10a$ comprises: a current unit $101a$, a calibrated current unit $102a$, and a differential amplifier $103a$. The current unit $101a$ comprises: a resistor $R_{13a}$ coupled between a voltage $V_{DD}$ and a node $13a$, and a transistor $M_{13a}$. The calibrated current unit comprises: a resistor $R_{11a}$ coupled between a voltage $V_{DD}$ and a node $11a$, and a transistor $M_{11a}$. In FIG. 1A, since the node $13a$ in the current unit $101a$ and the node $11a$ in the calibrated current unit $102a$ are virtually short-circuited at the input terminals of the differential amplifier $103a$, the voltage at node $13a$ is substantially equal to the voltage at node $11a$. As a result, the current $I_{REF}$ flowing through the calibrated current unit $102a$ and the current I flowing through the current unit $101a$ are independent of the aspect ratio (W/L) or the error in threshold voltage of the transistors $M_{11a}$ and $M_{13a}$, and is thus determined by the resistance ratio of the resistor $R_{13a}$ and the resistor $R_{11a}$.

Therefore, the current I flowing through the current unit $101a$ equals to the current $I_{REF}$ flowing through the calibrated current unit $102a$ when resistor $R_{13a}$ and resistor $R_{11a}$ are identical. Meanwhile, the gate voltage of the transistor $M_{13a}$ in the current unit $101a$ is adjusted to a calibrated bias voltage because the voltages at node $13a$ and node $11a$ are identical. The calibrated bias voltage indicates the calibrated result that current I equals the current $I_{REF}$. More particularly, the aspect ratios for $M_{11a}$ and $M_{13a}$ are identical. However, other aspect ratio values can also be used in the present invention.

Figure 1B:
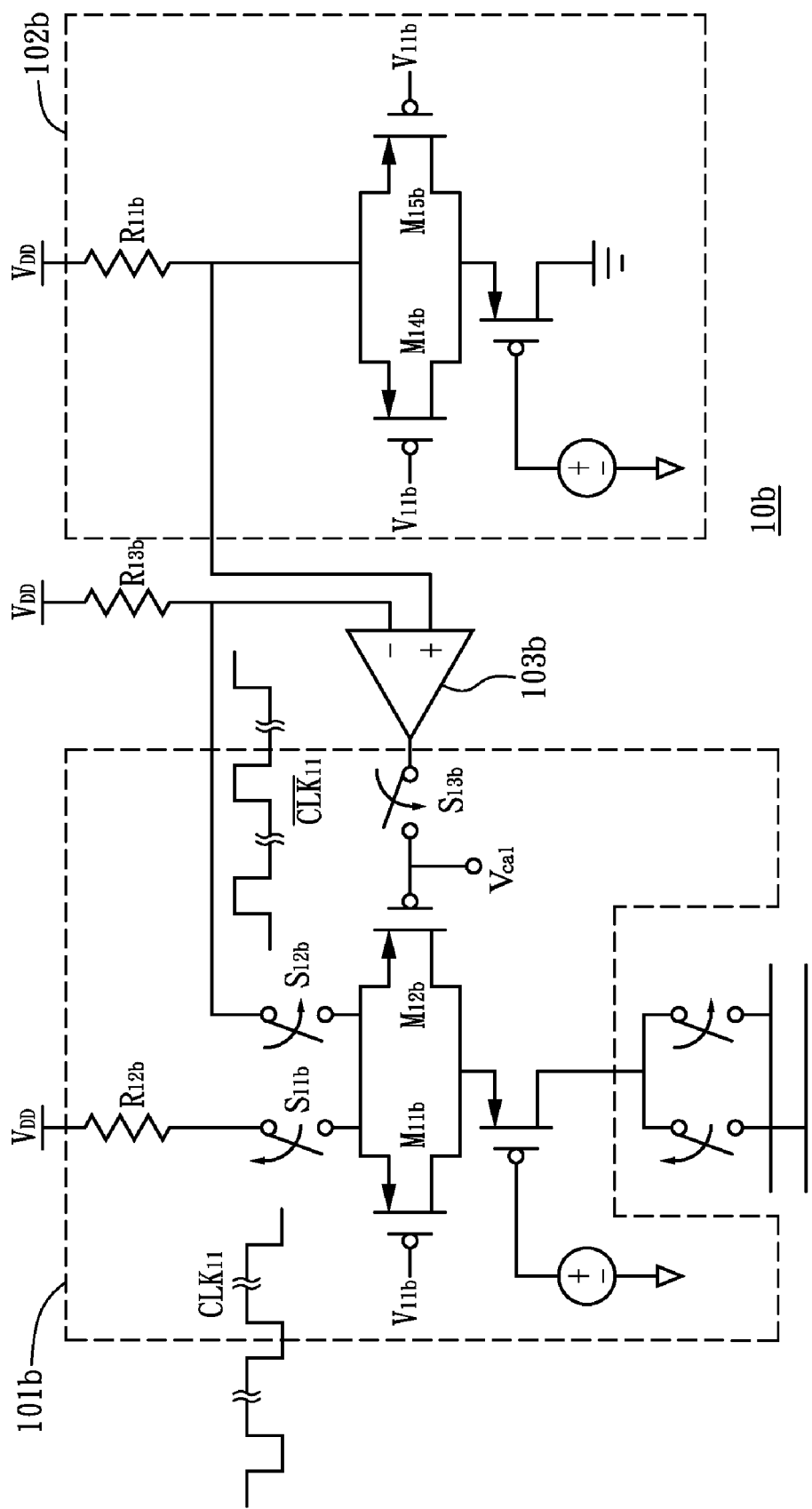
FIG. 1B is a schematic diagram of a self-calibrated current source having switches according to a preferred embodiment of the present invention.

Any one with ordinary skill in the art may scale up or scale down the ratio between the resistor $R_{13a}$ and resistor $R_{11a}$ and adjust the aspect ratio of the transistor that operates with the resistors. For example, if the ratio between the resistor $R_{13a}$ and the resistor $R_{11a}$ is 2:1, the ratio of currents flowing through the resistor $R_{13a}$ and the resistor $R_{11a}$ is 1:2. Any one with ordinary skill in the art can make modifications by setting the aspect ratio (L/W) for the $M_{11a}$ and $M_{13a}$ to be 2:1. Meanwhile, the gate voltages of the $M_{11a}$ and $M_{13a}$ are identical or nearly identical. FIG. 1B is a schematic diagram of a self-calibrated current source $10b$ having switches according to a preferred embodiment of the present invention. The current source $10b$ comprises a current unit $101b$, a calibrated current unit $102b$, and a differential amplifier $103b$. In the present invention, the current unit $101b$ further comprises a plurality of switches so that the current source $10b$ is calibrated when operation and calibration are carried out simultaneously.

The current unit $101b$ comprises: at least a first transistor $M_{11b}$ having a source coupled to a terminal of a second resistor $R_{12b}$ by way of a first switch $S_{11b}$ and a second transistor $M_{12b}$ having a source coupled to a terminal of a third resistor $R_{13b}$ by way of a second switch $S_{12b}$. The calibrated current unit $102b$ is, preferably, a replica of the current unit $101b$ (wherein the transistors in the calibrated current unit 102 and the aspect ratio in the current unit 101 have been similarly disclosed in FIG. 1A and descriptions thereof are not repeated herein). The calibrated current unit $102b$ further comprises reference current source transistors $M_{14b}$ and $M_{15b}$ having sources coupled to a terminal of a first resistor $R_{11b}$ so that the sources of $M_{14b}$ and $M_{15b}$ are used as a calibration reference for the differential amplifier $103b$. The differential amplifier $103b$ has an output terminal for outputting a calibration voltage Vcal coupled to a gate of the second transistor $M_{12b}$ by way of a third switch $S_{13b}$ and has a negative input terminal periodically coupled to a terminal of the third resistor $R_{13b}$ and a positive input terminal receiving the calibration reference voltage so that the positive and negative input terminals are virtually short-circuited. The gate of the first transistor $M_{11b}$ is coupled to a reference voltage $V_{11b}$. The first switch $S_{11b}$ is controlled by a first clock $CLK_{11}$, the second/third switch $S_{12b/13b}$ is controlled by a reverse clock of the first clock $CLK_{11}$, and the first transistor $M_{11b}$ and the second transistor $M_{12b}$ have drains coupled to each other and sources coupled to each other.

Any one with ordinary skill in the art can readily understand that the current unit $101b$ operates in a calibration phase when the first clock $CLK_{11}$ and its reverse clock are applied so that, for example, $S_{11b}$ is opened and $S_{12b/13b}$ is on. The calibration reference voltage enables the positive and negative input terminals of the differential amplifier $103b$ to be virtually short-circuited so that the ratio of currents flowing through the first resistor $R_{11b}$ and the third resistor $R_{13b}$ is $R_{13b}/R_{11b}$. Therefore, the gate voltage of the second transistor $M_{12b}$ is adjusted to achieve calibration.

Then, when $S_{12b/13b}$ is open and $S_{11b}$ is on for the normal operation phase, the gate of the second transistor $M_{12b}$ is open and the gate voltage of the second transistor $M_{12b}$ is maintained at the calibration voltage Vcal in a calibration phase. When leakage happens to the gate of the second transistor $M_{12b}$, the current unit $101b$ can operate in the calibration phase to stabilize the calibration voltage Vcal of the calibration phase. In other words, except for leakage due to an open circuit, the sum of the current through the first transistor $M_{11b}$ and the current through the second transistor $M_{12b}$, i.e., the current through the third resistor $R_{13b}$ is identical in the calibration phase and the normal operation phase.

It is derived from the disclosure of the present invention that a multi-bit DAC may comprise a plurality of current units $101b$, one of which is chosen in turn to operate in the calibration phase and the others in the normal operation phase.

In view of calibration, the DAC using a self-calibrated current source $10b$ in FIG. 1B of the present invention only requires a calibration current unit, a differential amplifier, and a plurality of switches with corresponding control clocks. Compared with the conventional art, the DAC of the present invention requires smaller area and less power consumption for self-calibration with higher linearity because the ratio between the output current and the reference current equals the resistance ratio. Moreover, the DAC can be calibrated at the time of operation.

Preferably, the first resistor $R_{11b}$, the second resistor $R_{12b}$ and the third resistor $R_{13b}$ exhibit the same resistance.

Preferably, the first transistor $M_{11b}$ and the second transistor $M_{12b}$ and the reference current source transistors $M_{14b}$ and $M_{15b}$ are all p-channel transistors.

Preferably, the reference current source transistors $M_{14b}$, $M_{15b}$, the first transistor $M_{11b}$ and the second transistor $M_{12b}$ are further cascaded to improve the output impedance.

Figure 2:
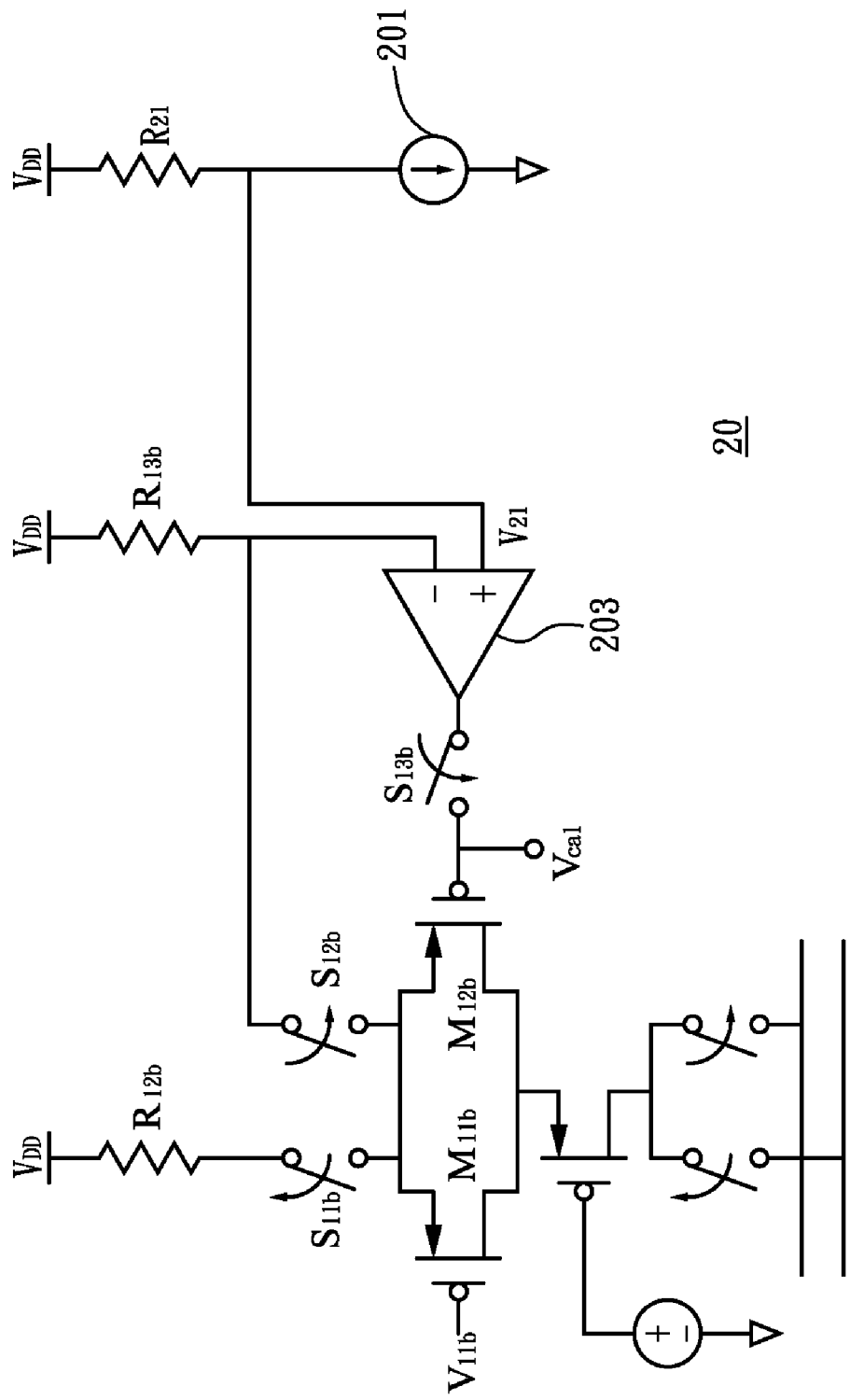
FIG. 2 is a schematic diagram of a self-calibrated current source according to another preferred embodiment of the present invention.

FIG. 2 is a schematic diagram of a self-calibrated current source 20 according to another preferred embodiment of the present invention. The current source 20 is different from the current source $10a$ in that a first resistor $R_{21}$ of the current source 20 is directly connected to a constant current source 201 to provide the positive input terminal of a differential amplifier 203 with a reference voltage $V_{21}$. The operation of the self-calibrated current source 20 in FIG. 2 is the same as the self-calibrated current source in FIG. 1B, and thus description thereof is not presented herein.

Figure 3A:
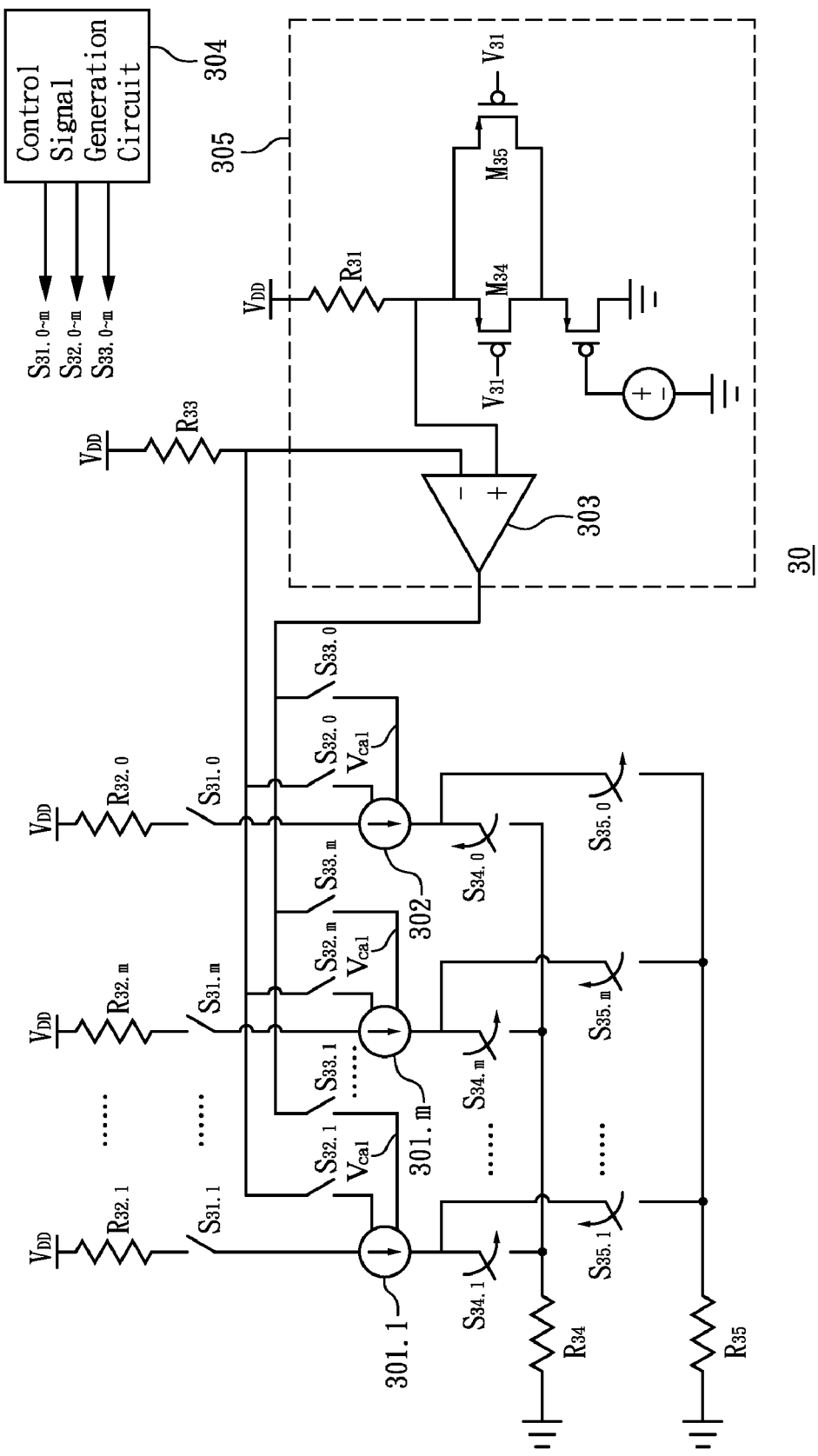
FIG. 3A is a schematic diagram of a segmented current steering DAC according to a preferred embodiment of the present invention.

FIG. 3A is a schematic diagram of a segmented current steering DAC 30 according to a preferred embodiment of the present invention. The segmented current steering DAC 30 comprises: a plurality of M-bit MSB (Most Significant Bit) segmented current sources $301.1$~$301.m$, an N-bit LSB (Least Significant Bit) segmented current source 302, a reference current source transistor $M_{34}$, $M_{35}$, a first transistor $M_{31}$ (not shown in FIG. 3A), which is a part of the M-bit segmented current source and the N-bit segmented current source and has a source coupling to one terminal of a second resistor $R_{32}$ (Referring to any one of $R_{32.0\sim m}$) via a first switch $S_{31}$, a second transistor $M_{32}$ (not shown in FIG. 3A), which is a part of the M-bit segmented current source and the N-bit segmented current source and has a source coupling to one terminal of a second resistor $R_{33}$ via a first switch $S_{32}$, and a differential amplifier 303, which has an output terminal coupling to the gate of the second transistor $M_{32}$ via a third switch $S_{33}$ and a negative input terminal periodically coupled to one terminal of the third resister $R_{33}$, and a positive input terminal coupled to one terminal of the first resistor $R_{31}$; wherein, the gates of the first transistor $M_{31}$ and the reference current source transistor $M_{34}$, both couple to a reference voltage $V_{31}$, and the first switch $S_{31}$ (Referring to any one of $S_{31.0\sim m}$) is controlled by a first clock $CLK_{31}$, and the second/third switch $S_{32/33}$ ($S_{32}$ referring to any one of $S_{32.0\sim m}$ and $S_{33}$ referring to any one of $S_{33.0\sim m}$) are both controlled by a reverse clock of the first clock $CLK_{31}$, and the first transistor $M_{31}$ is respectively coupled to the drain and the source of the second transistor $M_{32}$. $M_{31}$ and $M_{32}$ are operated as the same manner with $M_{11b}$ and $M_{12b}$ in FIG. 2.

Figure 3B:
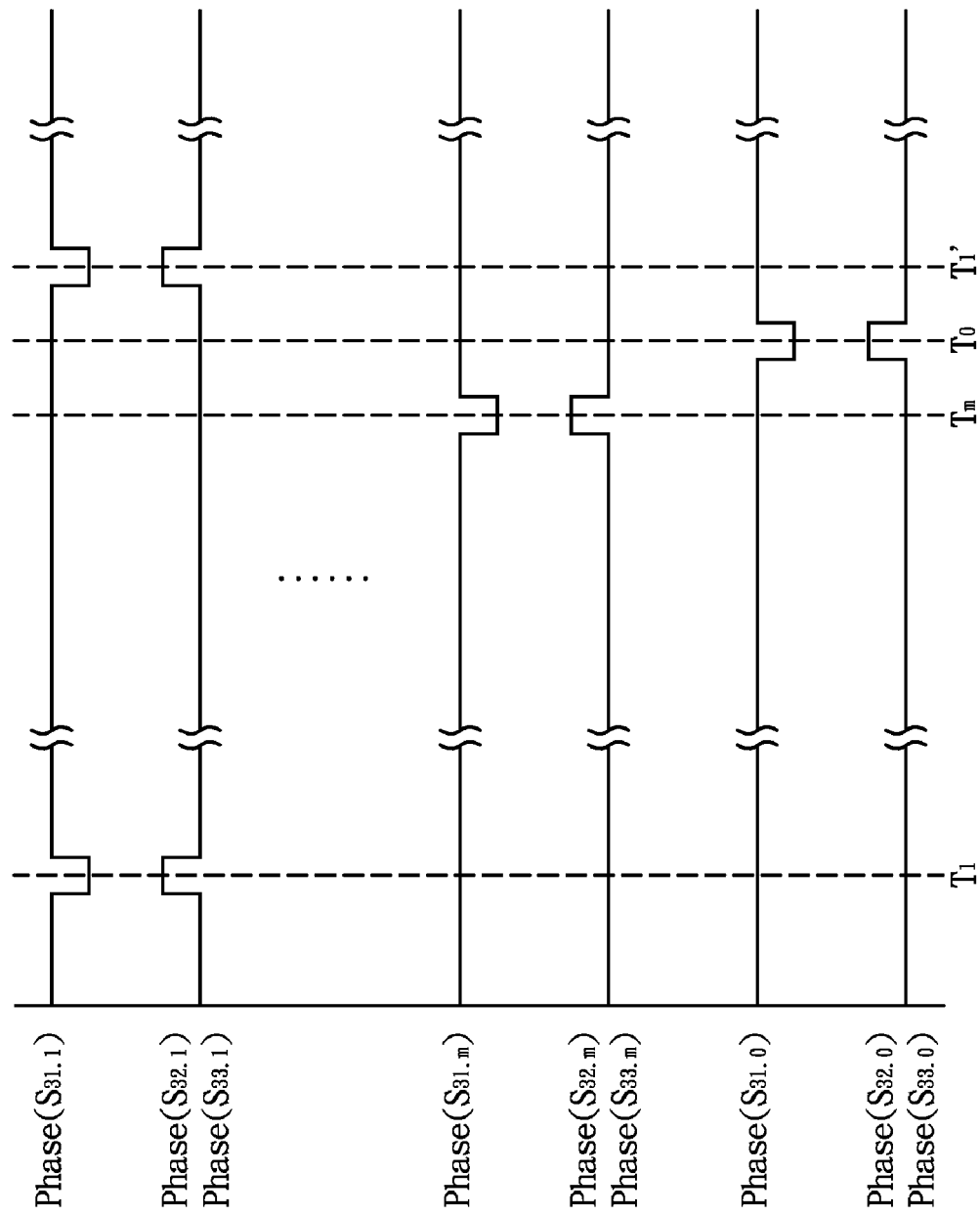
FIG. 3B is a clock diagram used in a control signal generation circuit according to the present invention.

Any one with ordinary skill in the art can derive that the segmented current steering DAC 30 comprises a control signal generation circuit 304 coupled to the current sources $301.1$~$301.m$ and 302 and a calibration circuit 305. The circuit 304 is capable of turning on or off the switches for controlling the current sources $301.1$~$301.m$ and 302 by the use of the clock signal (or a digital signal using a look-up table) according to a pre-set calibration procedure (for example, in the order of $301.1$, $301.2$ ... $301.m$, 302). FIG. 3B is a clock diagram used in a control signal generation circuit according to the present invention.

Preferably, as previously stated, the switches in the current source can be turned on or off using the clock signal in turn according to the current source $301.1$ to $301.m$ and the current source 302 so as to achieve calibration of the current sources $301.1$ to $301.m$ and the current source 302. In the present embodiment, the current sources $301.1$ to $301.m$ and 302 are implemented using the current source $101b$ shown in FIG. 1B. During calibration, the output voltage from the resistor $R_{34}/R_{35}$ is continuous to achieve background calibration no matter how the control clock for the switch $S_{34}$ ($S_{34.0\sim m}$)/$S_{35}$ ($S_{35.0\sim m}$) changes.

Preferably, the first resistor $R_{31}$, the second resistor $R_{32}$ (Referring to any one of $R_{32.0\sim m}$), and the third resistor $R_{33}$ exhibit the same resistance. The first resistor $R_{31}$, the second resistor $R_{32}$, and the third resistor $R_{33}$ may be modified according to the current steering DAC 30. The first resistor $R_{31}$, the second resistor $R_{32}$, and the third resistor $R_{33}$ are coupled to a transistor that can be adjusted analogically according to the gate voltage of the transistor.

Preferably, the first transistor $M_{31}$ and the second transistor $M_{32}$ and the reference current source transistor 303 are all p-channel transistors.

Preferably, the reference current source transistors $M_{34}$, $M_{35}$, the first transistor $M_{31}$ and the second transistor $M_{32}$ are further cascaded to improve the output impedance.

FIG. 3B is a clock diagram that shows the plurality of signals are generated by using a control signal generation circuit 304 according to the present invention. The phase $(S_{31.1})$ at time $T_1$ is for disabling, while the phases $(S_{32.1})$ and $(S_{33.1})$ at time $T_1$ are for enabling. At the same time $(T_1)$, the current source 301.1 and the calibration circuit 305 are virtually short-circuited. Thereby, the current source 301.1 is calibrated and the other current sources 301.2~301.$m$ and 302 still operate in the normal mode.

Similarly, the phase $(S_{31.m})$ at time $T_m$ is for disabling and the phases $(S_{32.m})$ and $(S_{33.m})$ at time $T_m$ are for enabling in FIG. 3B. At the same time $(T_m)$, the current source 301.$m$ and the calibration circuit 305 are virtually short-circuited. Thereby, the current source 301.$m$ is calibrated and the other current sources still operate in the normal mode.

Similarly, at time $T_0$, the current source 302 and the calibration circuit 305 are virtually short-circuited. Thereby, the current source 302 is calibrated and the other current sources still operate in the normal mode.

At time $T_1'$, background calibration can be finished by repeating the duty cycles.

Figure 4:
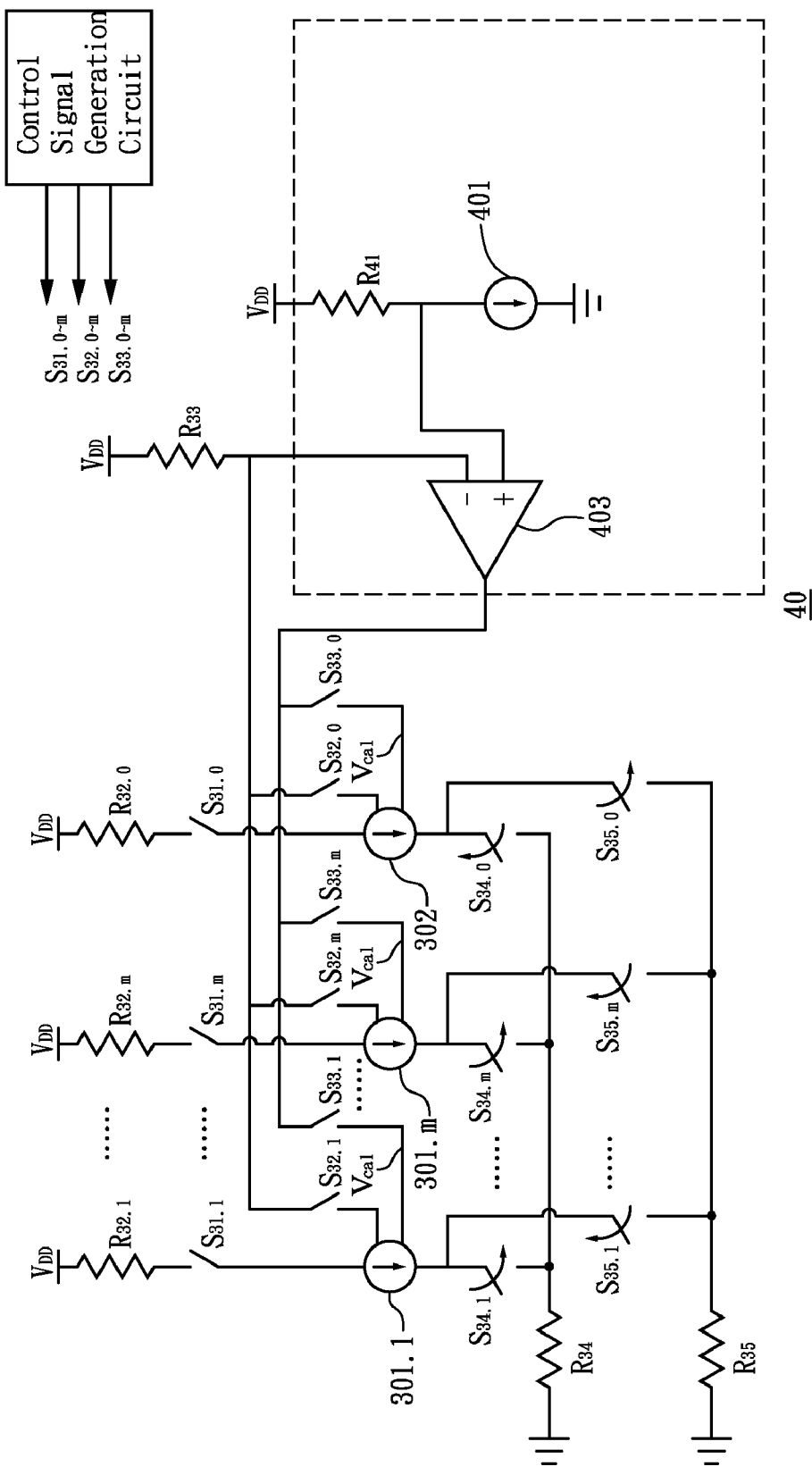
FIG. 4 is a schematic diagram of a segmented current steering DAC according to another preferred embodiment of the present invention.

FIG. 4 is a schematic diagram of a segmented current steering DAC 40 according to another preferred embodiment of the present invention. The DAC 40 is different from the DAC 30 in that the a first resistor $R_{41}$ of the DAC 40 is directly connected to a constant current source 401 so provide the positive input terminal of a differential amplifier 403 with a reference voltage.

FIG. 5 is a flowchart of a method for operating a segmented current steering DAC
in FIG. 3A according to a preferred embodiment of the present invention. The method comprises steps as described herein:

In step 501, a DAC as shown in FIG. 3A is provided.

In step 502, each MSB segmented current source in the DAC 30 is calibrated in $(2^M-1)$ duty cycles in turn.

In step 503, all of N-bit LSB segmented current sources in the DAC 30 are calibrated in the $(2^M)$th duty cycle.

In step 504, step 502 is performed.

Preferably, the method in FIG. 5 further comprises a step of providing at least a thermometer-coded input signal and a binary-coded input signal to control an output current from the DAC 30 in FIG. 3A in steps 502 and 503.

Preferably, in the method in FIG. 5, the difference between the sum of all of the N-bit LSB segmented current sources and a current flowing through the reference resistor is a LSB segmented current.

FIG. 6 is a flowchart of a method for operating a segmented current steering DAC
in FIG. 4 according to another preferred embodiment of the present invention. The method comprises steps as described herein:

In step 601, a DAC as shown in FIG. 4 is provided.

In step 602, each MSB segmented current source in the DAC 40 is calibrated in $(2^M-1)$ duty cycles in turn.

In step 603, all of N-bit LSB segmented current sources in the DAC 40 are calibrated in the $(2^M)$th duty cycle.

In step 604, step 602 is performed.

Preferably, the method in FIG. 6 further comprises a step of providing at least a thermometer-coded input signal and a binary-coded input signal to control an output current from the DAC 40 in FIG. 4 in steps 602 and 603.

Preferably, in the method in FIG. 6, the difference between the sum of all of the N-bit LSB segmented current sources and a current flowing through the reference resistor is a LSB segmented current.

Although this invention has been disclosed and illustrated with reference to particular embodiments, the principles involved are susceptible for use in numerous other embodiments that will be apparent to persons skilled in the art. This invention is, therefore, to be limited only as indicated by the scope of the appended claims.

What is claimed is:

1. A self-calibrated current source, comprising at least:
   a reference current source transistor having a source coupled to a terminal of a first resistor, the source being a calibration reference;
   a first transistor having a source coupled to a terminal of a second resistor by way of a first switch;
   a second transistor having a source coupled to a terminal of a third resistor by way of a second switch; and
   a differential amplifier having an output terminal coupled to a gate of the second transistor by way of a third switch and having a negative input terminal coupled to a terminal of the third resistor and a positive input terminal coupled to the terminal of the first resistor;
   wherein a gate of the first transistor is coupled to a reference voltage, the first switch is controlled by a first clock, the second/third switch is controlled by a reverse clock of the first clock, and the first transistor and the second transistor have drains coupled to each other and sources coupled to each other.

2. The self-calibrated current source as recited in claim 1, wherein the first resistor, the second resistor, and the third resistor exhibit the same resistance.

3. The self-calibrated current source as recited in claim 1, wherein the first transistor, the second transistor and the reference current source transistor are all p-channel transistors.

4. The self-calibrated current source as recited in claim 1, wherein the reference current source transistor, the first transistor and the second transistor are further cascaded to enhance the output impedance.

5. The self-calibrated current source as recited in claim 1, wherein the first switch is complementary to the second switch and the third switch, respectively.

6. A self-calibrated current source, comprising at least:
   a reference resistor having a terminal coupled to a constant current source to provide a calibration reference voltage;
   a first transistor having a source coupled to a terminal of a plurality of first resistors by way of a first switch;
   a second transistor having a source coupled to a terminal of a second resistor by way of a second switch; and
   a differential amplifier having an output terminal coupled to a gate of the second transistor by way of a third switch and having a negative input terminal coupled to a terminal of the second resistor and a positive input terminal receiving the calibration reference voltage;
   wherein a gate of the first transistor is coupled to a reference voltage, the first switch is controlled by a first clock, the second/third switch is controlled by a reverse clock of the first clock, and the first transistor and the second transistor have drains coupled to each other and sources coupled to each other.

7. The self-calibrated current source as recited in claim 6, wherein the reference resistor, the first resistor, and the second resistor exhibit the same resistance.

8. A segmented current steering DAC, comprising:
an M-bit MSB segmented current source capable of generating an output current at an output terminal of the DAC according to a thermometer-coded input signal;
an N-bit LSB segmented current source capable of generating an output current at the output terminal of the DAC according to a binary-coded input signal;
a reference current source transistor having a source coupled to a terminal of a first resistor, the source being a calibration reference;
a first transistor used as part of the M-bit MSB segmented current source and the N-bit LSB segmented current source, the first transistor having a source coupled to a terminal of a second resistor by way of a first switch;
a second transistor used as part of the M-bit MSB segmented current source and the N-bit LSB segmented current source, the second transistor having a source coupled to a terminal of a third resistor by way of a second switch; and
a differential amplifier having an output terminal coupled to a gate of the second transistor by way of a third switch and having a negative input terminal coupled to a terminal of the third resistor in turn and a positive input terminal coupled to the terminal of the first resistor so that the positive and the negative input terminals are virtually short-circuited;
wherein a gate of the first transistor and a gate of the reference current source transistor are coupled to a first reference voltage, the first switch is controlled by a first clock, and the first transistor and the second transistor have drains coupled to each other and sources coupled to each other.

9. The DAC as recited in claim 8, wherein the first resistor, the second resistor, and the third resistor exhibit the same resistance.

10. The DAC as recited in claim 8, wherein the first transistor, the second transistor and the reference current source transistor are all p-channel transistors.

11. The DAC as recited in claim 8, wherein the reference current source transistor, the first transistor and the second transistor are further cascaded to enhance the output impedance.

12. The DAC as recited in claim 8, wherein the first switch is complementary to the second switch and the third switch, respectively.

13. A segmented current steering DAC, comprising:
at least an M-bit MSB segmented current source capable of generating an output current at an output terminal of the DAC according to a thermometer-coded input signal;
at least an N-bit LSB segmented current source capable of generating an output current at the output terminal of the DAC according to a binary-coded input signal;
a reference resistor having a terminal coupled to a constant current source to provide a calibration reference voltage;
a first transistor used as part of the M-bit MSB segmented current source and the N-bit LSB segmented current source, the first transistor having a source coupled to a terminal of a second resistor by way of a first switch;
a second transistor used as part of the M-bit MSB segmented current source and the N-bit LSB segmented current source, the second transistor having a source coupled to a terminal of a third resistor by way of a second switch; and
a differential amplifier having an output terminal coupled to a gate of the second transistor by way of a third switch and having a negative input terminal coupled to a terminal of the third resistor and a positive input terminal receiving the calibration reference voltage so that the positive and the negative input terminals are virtually short-circuited;
wherein a gate of the first transistor and a gate of the reference current source transistor are coupled to a first reference voltage.

14. The DAC as recited in claim 13, wherein the reference resistor, the second resistor, and the third resistor exhibit the same resistance.

15. A method of calibrating a segmented current steering DAC, comprising steps of:
(a) providing a DAC that comprises:
an M-bit MSB segmented current source capable of generating an output current at an output terminal of the DAC according to a thermometer-coded input signal;
an N-bit LSB segmented current source capable of generating an output current at the output terminal of the DAC according to a binary-coded input signal;
a reference current source transistor having a source coupled to a terminal of a first resistor, the source being a calibration reference;
a first transistor used as part of the M-bit MSB segmented current source and the N-bit LSB segmented current source, the first transistor having a source coupled to a terminal of a second resistor by way of a first switch;
a second transistor used as part of the M-bit MSB segmented current source and the N-bit LSB segmented current source, the second transistor having a source coupled to a terminal of a third resistor by way of a second switch; and
a differential amplifier having an output terminal coupled to a gate of the second transistor by way of a third switch and having a negative input terminal coupled to a terminal of the third resistor in turn and a positive input terminal coupled to the terminal of the first resistor so that the positive and the negative input terminals are virtually short-circuited,
wherein a gate of the first transistor and a gate of the reference current source transistor are coupled to a first reference voltage, the first switch is controlled by a first clock, and the first transistor and the second transistor have drains coupled to each other and sources coupled to each other;
(b) calibrating each MSB segmented current source in the DAC in $(2^m-1)$ duty cycles in turn;
(c) calibrating the sum of all of N-bit LSB segmented current sources in the DAC in the $(2^M)$th duty cycle; and
(d) returning to step (b).

16. The method of calibrating a segmented current steering DAC as recited in claim 15, further comprising a step of:
in steps (b) and (c), providing at least a thermometer-coded input signal and a binary-coded input signal to control an output current from the DAC.

17. The method of calibrating a segmented current steering DAC as recited in claim 15, wherein the difference between the sum of all of the N-bit LSB segmented current sources and the reference current source is a LSB segmented current.

18. A method of calibrating a segmented current steering DAC, comprising steps of:
(a) providing a DAC that comprises:
at least an M-bit MSB segmented current source capable of generating an output current at an output terminal of the DAC according to a thermometer-coded input signal;

at least an N-bit LSB segmented current source capable of generating an output current at the output terminal of the DAC according to a binary-coded input signal;

a reference resistor having a terminal coupled to a constant current source to provide a calibration reference voltage;

a first transistor used as part of the M-bit MSB segmented current source and the N-bit LSB segmented current source, the first transistor having a source coupled to a terminal of a second resistor by way of a first switch;

a second transistor used as part of the M-bit MSB segmented current source and the N-bit LSB segmented current source, the second transistor having a source coupled to a terminal of a third resistor by way of a second switch; and a differential amplifier having an output terminal coupled to a gate of the second transistor by way of a third switch and having a negative input terminal coupled to a terminal of the third resistor and a positive input terminal receiving the calibration reference voltage so that the positive and the negative input terminals are virtually short-circuited, wherein a gate of the first transistor and a gate of the reference current source transistor are coupled to a first reference voltage;

(b) calibrating each MSB segmented current source in the DAC in ($2^m-1$) duty cycles in turn;

(c) calibrating the sum of all of N-bit LSB segmented current sources in the DAC in the ($2^M$)th duty cycle; and (d) returning to step (b).

19. The method of calibrating a segmented current steering DAC as recited in claim 18, further comprising a step of:

in steps (b) and (c), providing at least a thermometer-coded input signal and a binary-coded input signal to control an output current from the DAC.

20. The method of calibrating a segmented current steering DAC as recited in claim 18, wherein the difference between the sum of all of the N-bit LSB segmented current sources and a current flowing through the reference resistor is a LSB segmented current.

21. A digital-to-analog conversion device with self-calibration, comprising:

a plurality of digital-to-analog conversion current units, comprising:

a first current unit capable of operating in one of a normal mode and a calibration according to a control signal; and a second current unit capable of operating in one of the normal mode and the calibration according to the control signal;

a calibration circuit capable of calibrating a current generated by the first current unit when the first current unit operates in the calibration mode and the second current unit operates in the normal mode according to the control signal, and calibrating a current generated by the second current unit when the second current unit operates in the calibration mode and the first current unit operates in the normal mode according to the control signal; and a control signal generation circuit coupled to the first current unit, the second current unit and the calibration circuit to generate the control signal.

22. The digital-to-analog conversion device with self-calibration as recited in claim 21, wherein the calibration circuit comprises:

a reference current unit capable of generating a reference current; and a comparison unit capable of generating a calibration signal according to the reference current and a current generated by the first current unit to further calibrate the current generated by the first current unit when the control signal controls the first current unit to operate in the calibration mode, and generating another calibration signal according to the reference current and a current generated by the second current unit to further calibrate the current generated by the second current unit when the control signal controls the second current unit to operate in the calibration mode.

23. The digital-to-analog conversion device with self-calibration as recited in claim 22, wherein the control signal generation circuit is capable of generating a calibration-mode control signal and a normal-mode control signal, the calibration-mode control signal controlling the first current unit and the second current unit to operate in the calibration mode and the normal-mode control signal controlling the first current unit and the second current unit to operate in the normal mode.

24. The digital-to-analog conversion device with self-calibration as recited in claim 23, wherein the calibration-mode control signal is a reverse signal of the normal-mode control signal.

25. The digital-to-analog conversion device with self-calibration as recited in claim 23, wherein the first current unit comprises a first switch and the second current unit comprises a second switch, so that the second switch decouples the calibration circuit and the second current unit according to the normal-mode control signal when the first switch couples the calibration circuit and the first current unit according to the calibration-mode control signal, and the first switch decouples the calibration circuit and the first current unit according to the normal-mode control signal when the second switch couples the calibration circuit and the second current unit according to the calibration-mode control signal.

26. The digital-to-analog conversion device with self-calibration as recited in claim 21, wherein the control signal generation circuit further comprises a look-up table so that the control signal is capable of being converted to a clock signal by multi-bit digital-to-analog conversion.

* * * * *